(12) United States Patent
Pinard et al.

(10) Patent No.: US 11,621,540 B2
(45) Date of Patent: Apr. 4, 2023

(54) HIGH POWERED LASER ELECTRONICS

(71) Applicant: IPG Photonics Corporation, Oxford, MA (US)

(72) Inventors: Adam Pinard, Carlisle, MA (US); Wolf Fuchs, Brimfield, MA (US); Keith Millea, Sutton, MA (US); Oleg Shkurikhin, Oxford, MA (US)

(73) Assignee: IPG PHOTONICS CORPORATION, Oxford, MA (US)

( * ) Notice: Subject to any disclaimer, the term of this patent is extended or adjusted under 35 U.S.C. 154(b) by 157 days.

(21) Appl. No.: 17/197,903

(22) Filed: Mar. 10, 2021

(65) Prior Publication Data
US 2021/0305765 A1    Sep. 30, 2021

Related U.S. Application Data

(60) Provisional application No. 63/049,320, filed on Jul. 8, 2020, provisional application No. 63/002,915, filed on Mar. 31, 2020.

(51) Int. Cl.
*H01S 3/13* (2006.01)
*H01S 5/068* (2006.01)
(Continued)

(52) U.S. Cl.
CPC ...... *H01S 5/06808* (2013.01); *H01S 5/02423* (2013.01); *H01S 5/042* (2013.01);
(Continued)

(58) Field of Classification Search
CPC .. H01S 5/06808; H01S 5/02423; H01S 5/042; H01S 5/4025; H01S 3/11; H01S 5/022; H01S 5/02438
See application file for complete search history.

(56) References Cited

U.S. PATENT DOCUMENTS 5,048,033 A    9/1991    Donahue et al.
5,163,063 A    11/1992    Yoshikawa et al.
(Continued)

FOREIGN PATENT DOCUMENTS

CN    200956304          10/2007
CN    100423428 C       10/2008
(Continued)

OTHER PUBLICATIONS

U.S. Appl. No. 62/002,915 to Adam Pinard et al., filed Mar. 31, 2020.

(Continued)

*Primary Examiner* — Kinam Park
(74) *Attorney, Agent, or Firm* — JDI Patent; Joshua Isenberg; Robert Pullman

(57) ABSTRACT

A laser system comprising high voltage AC-to-DC power converter and one or more current sources coupled to the high voltage AC-to-DC power converter without a DC-to-DC converter between the one or more current sources and the AC-to-DC power source. Each of the one or more current sources includes a high voltage switch and one or more independent safety shutoffs. A laser module is operably coupled to the one or more current source and configured to emit electromagnetic radiation wherein the one or more safety shutoffs are configured to disable emission of electromagnetic radiation from the laser module when triggered.

29 Claims, 5 Drawing Sheets

(51) Int. Cl.
   *H01S 5/40*    (2006.01)
   *H01S 5/042*   (2006.01)
   *H01S 5/024*   (2006.01)
   *H01S 3/11*    (2023.01)
   *H01S 5/022*   (2021.01)

(52) U.S. Cl.
   CPC .............. *H01S 5/4025* (2013.01); *H01S 3/11* (2013.01); *H01S 5/022* (2013.01); *H01S 5/02438* (2013.01)

(56) References Cited

U.S. PATENT DOCUMENTS

| | | | |
|---|---|---|---|
| 7,276,814 B2 | 10/2007 | Pozzuoli et al. | |
| 7,792,166 B2 | 9/2010 | Borschowa | |
| 8,724,669 B2 | 5/2014 | Guskov | |
| 9,356,415 B2 | 5/2016 | Volodin et al. | |
| 9,666,677 B1* | 5/2017 | Raring | H01L 21/6835 |
| 2004/0208650 A1 | 10/2004 | Suzuki | |
| 2005/0018715 A1 | 1/2005 | Varshneya et al. | |
| 2006/0088071 A1 | 4/2006 | Hovakimyan | |
| 2007/0280314 A1 | 12/2007 | Keh et al. | |
| 2008/0225558 A1* | 9/2008 | Gordon | H02M 3/33573 363/21.15 |
| 2009/0128347 A1 | 5/2009 | Bucella et al. | |
| 2010/0091807 A1 | 4/2010 | Deppe et al. | |
| 2011/0085576 A1 | 4/2011 | Crawford et al. | |
| 2012/0321337 A1 | 12/2012 | Uezono | |
| 2013/0308668 A1* | 11/2013 | Guskov | H03K 3/53 372/38.04 |
| 2014/0362882 A1* | 12/2014 | Sgandurra | H01S 5/06825 372/29.012 |
| 2015/0255943 A1* | 9/2015 | Voloden | H01S 5/06825 372/6 |
| 2017/0163005 A1* | 6/2017 | Takigawa | H01S 5/02453 |
| 2017/0244212 A1 | 8/2017 | Burkholder | |
| 2019/0109429 A1 | 4/2019 | Maeda | |
| 2020/0075455 A1* | 3/2020 | Dilsch | H01L 23/473 |

FOREIGN PATENT DOCUMENTS

| | | |
|---|---|---|
| CN | 102546028 B | 7/2014 |
| EP | 0425309 B1 | 2/1997 |
| EP | 3367519 B1 | 7/2019 |
| IL | 96089 A | 1/1995 |
| JP | H06315279 A | 11/1994 |
| JP | 2588361 B2 | 3/1997 |
| JP | H09246634 A | 9/1997 |
| JP | 2000294862 A | 10/2000 |
| JP | 2003001463 A | 1/2003 |
| JP | 2006128374 A | 5/2006 |
| JP | 4832730 B2 | 12/2011 |
| JP | 5278746 B2 | 9/2013 |
| JP | 5713622 B2 | 5/2015 |
| JP | 5920870 B2 | 5/2016 |
| KR | 100317390 B1 | 12/2001 |
| SU | 1277358 A1 | 12/1986 |

OTHER PUBLICATIONS

U.S. Appl. No. 62/049,320 to Adam Pinard et al., filed Jul. 8, 2020.
International Search Report and Written Opinion for International Application No. PCT/US2021/021742.

* cited by examiner

HIGH POWERED LASER ELECTRONICS

CLAIM OF PRIORITY

This application claims the priority benefit of U.S. Provisional Patent Application No. 63/002,915 filed Mar. 31, 2020, the entire contents of which are incorporated herein by reference.

This application claims the priority benefit of U.S. Provisional Patent Application No. 63/049,320 filed Jul. 8, 2020, the entire contents of which are incorporated herein by reference.

FIELD OF THE INVENTION

Aspects of the present disclosure generally relate to laser power systems and more particularly to improved laser power systems with redundant safety measures.

BACKGROUND OF THE INVENTION

Laser systems create collimated and focused light from various energy sources. High-powered laser systems often use a high-energy light source or sources in combination with a gain media such as a doped crystalline rod in a reflective cavity, doped fiber optic cable, photo reactive liquid, etc. High-energy light sources, such as halogen flash bulbs, high voltage light emitting diodes or laser diodes, often require a large amount of current and voltage with fast switching time.

High-powered lasers are dangerous. Exposure of a non-reflective surface to High-energy laser light can cause extreme surface temperatures and pulsed laser light can cause flash sublimation of surface material resulting in cratering of the surface. Living tissue reacts to laser light differently based on the wavelength of the light but in any case, exposure of the eyes to laser light can have extremely negative consequences ranging from redness to permanent blindness. At high energy levels, even partially reflected laser light can cause blindness. The FDA has limited the sale of high-powered lasers to the public and placed specific restrictions on the operation of high-powered lasers sold to qualified individuals and groups. For high-powered lasers multiple safety measures are often employed to ensure that accidental lasing does not occur. High-powered lasers are often operated in a special room, which notifies those outside if the laser is in operation. These, special rooms often have switches which trip when a door to the room is opened and operate to deactivate the laser. Often high-powered lasers are operated on laser tables, which are designed to be below the height of a person's head and have shutters and polarized coverings to prevent accidental exposure to laser light. An important aspect of laser safety is ensuring that the laser is off and light does not escape the laser generation areas.

In the past, lower powered laser systems used an opaque cover or mechanical shutter to stop light from exiting the laser generation areas. With modern high-powered lasers, using a cover or shutter is not possible because the light from such lasers will burn or melt most materials. Current high-powered laser systems cut the voltage between the laser voltage source and the current source for the laser generation systems. A discharge circuit is placed between the voltage source and the current source to prevent accidental discharge and reduce the likelihood of shock. This layout is costly because it requires additional switching and discharge circuitry.

Additionally, current laser systems are designed with current source systems that operate at low voltages. As such, voltage sources are required to covert moderately high voltage Alternating current (AC) such as current from a wall socket to low voltage Direct current (DC). These existing systems are complex because they require not only AC to DC conversion but also DC-to-DC voltage step down systems.

It is within this context that aspects of the present disclosure arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

According to embodiments of the present disclosure, high voltage switches may be used in the current generation portion of the power system of a laser. The high voltage switches may be fast switching, high-voltage tolerant transistors such as Gallium Nitride transistors or silicon carbide transistors. Use of the high-voltage switches allows for numerous improvements in other areas of the laser power system. One area of improvement is in further simplifying the voltage supply system. A second area of improvement is a reduction in safety components while maintaining redundant safety systems. A third area of improvement is cooling.

Figure 1:
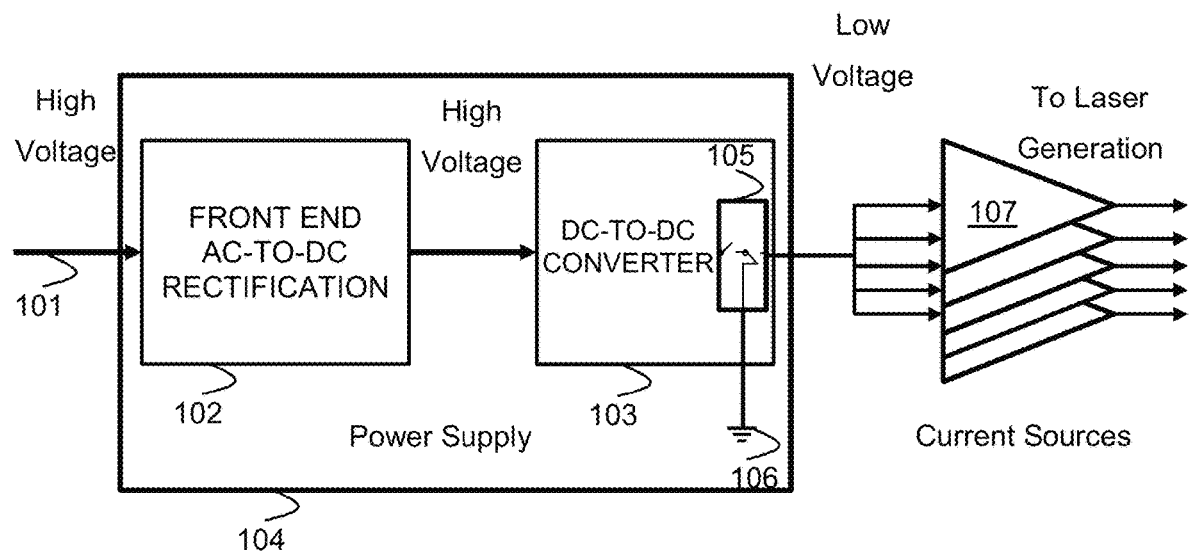
FIG. 1 is a schematic diagram of a prior art laser system power supply.

FIG. 1 Shows a prior art laser power system. The prior art laser power system receives a high to moderate AC voltage from an AC voltage source 101. The high to moderate AC voltage source may be a 120-volt power outlet, 220-volt power outlet, 240-volt power outlet, 400-volt power outlet etc. The AC voltage source may supply current as high as 30 amps and in some implementations even higher supply currents are possible. The front-end AC-to-DC rectification module 102 receives the AC voltage first. According to some aspects of the present disclosure, the AC voltage may be filtered through additional AC line filtering before the AC-to-DC rectification 102. The front-end AC-to-DC rectification converts the AC line voltage into DC voltage. After rectification, the DC voltage may be high as high as 800 volts peak. The peak 800-volt DC power is then provided to the DC-to-DC converter 103 to reduce the voltage to tolerable limits. The DC-to-DC converter 103 may be a buck converter, (in some cases a boost converter) or a fly-back converter. The Front-end AC-to-DC rectifier 102 and the DC-to-DC converter 103 may be part of the same discrete power supply 104 or power supply unit within the laser system.

A major drawback of the inclusion of a DC-to-DC converter in the power supply unit is that for operation of the converter an accumulation capacitor is required. The accumulation capacitor acts as storage for electricity during cycling of the DC-to-DC converter and thus must be charged at a high voltage. Charged high voltage capacitors are extremely dangerous because there is no indication that the capacitor is charged and a short circuit between the electrodes of a charged capacitor will cause an instantaneous discharge of the capacitors at extremely high currents. Additionally, without an additional safety shutoff system the DC-to-DC converter presents a danger because a single level of safety (one transistor) on the current source protects the system from accidental laser discharge. If the transistor fails shorted and DC is present, light will be emitted. The power system of FIG. 1 may include a safety shutoff system 105 to reduce the likelihood of accidental lasing or discharge of high voltage capacitors. The shutoff system may include two switches arranged to isolate the accumulator capacitors. Additionally, the safety shutoff system may include a discharge shunt 106 configured to discharge the accumulator capacitors when the safety system is engaged. This safety system adds complexity and additional cost because high voltage discharge lines must be routed around the laser system and additional safety switching control systems must be designed and implemented.

The DC-to-DC converter 103 portion of the power supply 104 steps down the voltage to a lower voltage that is more tolerable to average applications. The lower voltage may be between 30 and 90 volts. The lower voltage is passed to the current sources 107. The current sources 107 create a controlled current for the laser diodes to operate on in the laser system. As shown the prior art device requires many constant current sources 107 because each constant current source 107 is operating at a lower voltage. This adds additional costs and components to the laser system.

Figure 2:
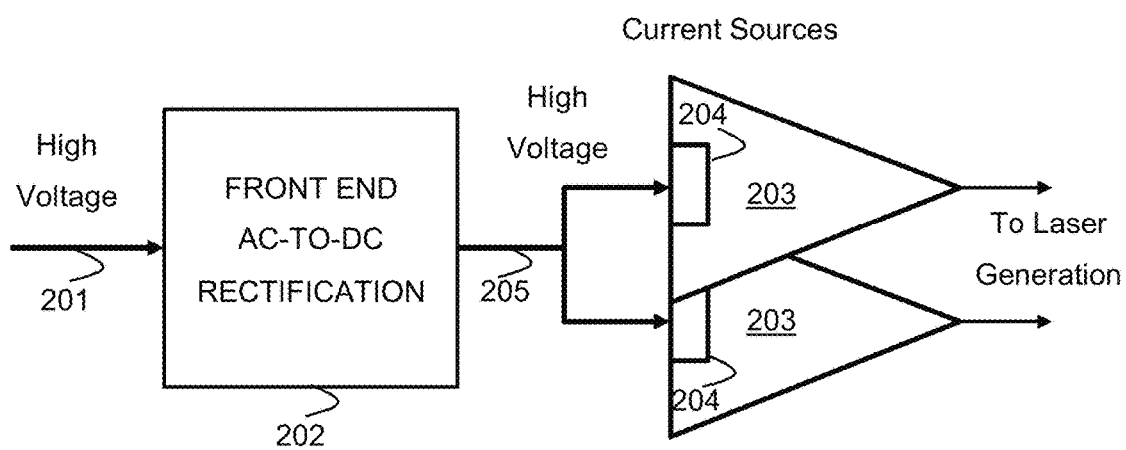
FIG. 2 is a schematic diagram of a high voltage laser system according to aspects of the present disclosure.

FIG. 2 shows the improved laser power system according to aspects of the present disclosure. As shown the improved laser system retains the front-end AC-to-DC rectifier 202 portion of the power supply but eliminates the costly DC-to-DC converter and safety shunt while maintaining operation with redundant safeties. The AC-to-DC rectifier 202 takes AC voltage from a moderate to high AC voltage source 201 and converts it to High Voltage DC electricity. The high voltage DC electricity is then passed 205 directly to the constant current sources 203 without a voltage step down conversion. Without the DC-to-DC converter, the safety switch system and discharge shunt are not necessary and therefore may be excluded. The redundant safety shutoff system 204 may be moved to the constant current supply 203. Moving the redundant safety shutoff system 204 to the constant current supply allows savings in parts because many parts already used in the constants current supply may be configured to serve the additional purpose of the safety shutoff without many additional components.

Additionally, as shown in FIG. 2 fewer constant current sources 203 are required to supply electricity to laser generation areas because each constant current source 203 operates at a higher voltage. The use of high voltage MOSFETs in the constant current sources 203 allows the constant current sources to operate at higher voltages and frequencies without breaking down. The redundant safety systems for the laser system is also integrated into the constant current source 203 and makes use of the high voltage MOSFETs as will be discussed with respect to FIGS. 3A and 3B.

Figure 3A:
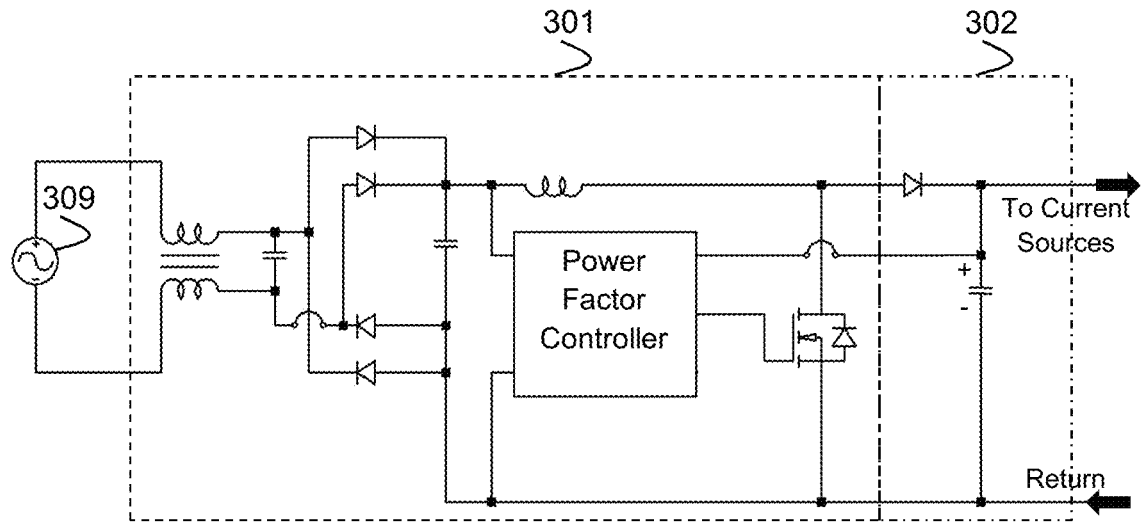
FIG. 3A is a simplified schematic circuit diagram of the AC-to-DC front end rectifier of the high voltage laser system according to aspects of the present disclosure.
Figure 3B:
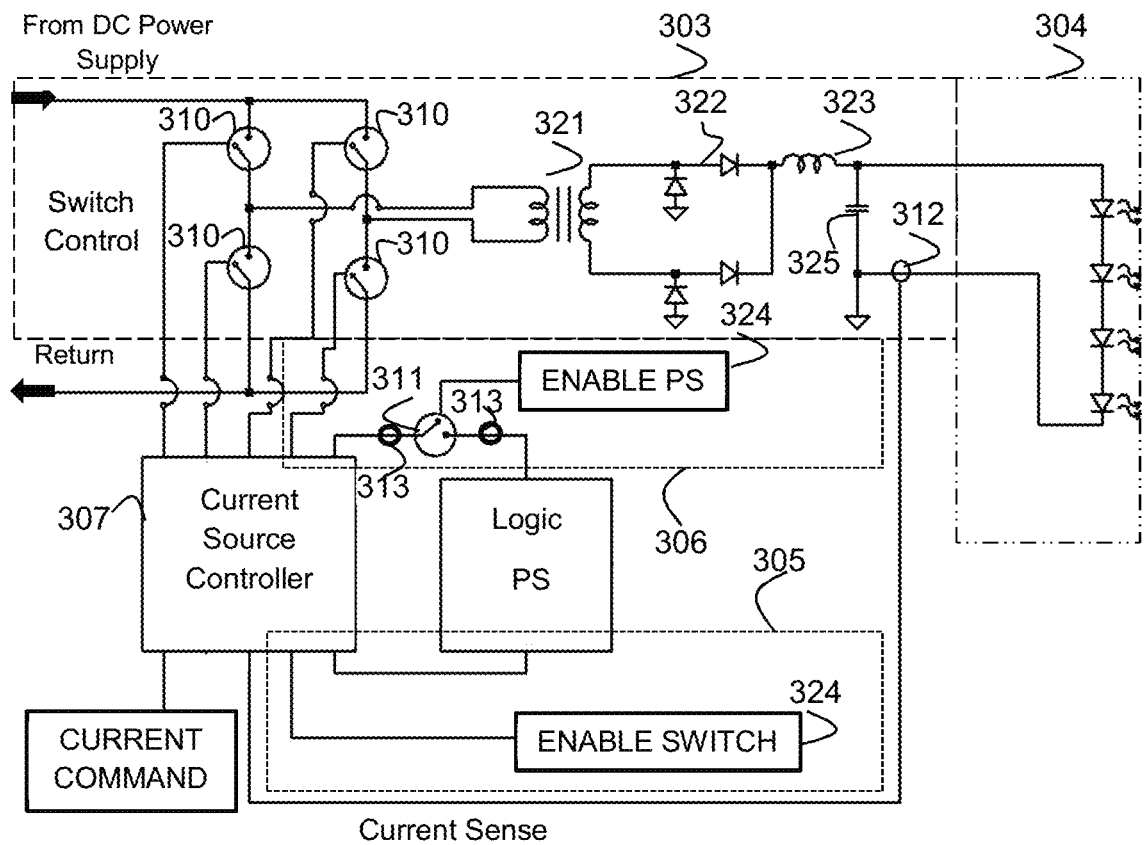
FIG. 3B is a simplified schematic circuit diagram of a constant current source of the high voltage laser system according to aspects of the present disclosure.

FIGS. 3A and 3B depict circuit diagrams of a simplified model of a laser system having a power module and laser generation module. As shown the laser system 300 may include a front-end AC-to-DC rectification component 301, a DC smoothing component 302, a current source 303, laser generation module 304, a first independent safety shut-off 305 and a second independent safety shutoff 306. The front-end AC-to-DC rectification component 301 as shown in FIG. 3A may receive AC voltage from an AC voltage source 309. The front-end AC-to-DC rectification 301 component may comprise a transformer and a rectifier circuit to convert AC voltage into DC voltage. Additionally, the AC-to-DC rectification component may include an inductor, a power factor controller and power factor switch. The power factor controller is configured to increase the power factor of the load using the power factor switch as shown. The DC smoothing component 302 may include a smoothing capacitor chosen to reduce voltage ripple. The smoothing component 302 may include a fairly large capacitor to store energy between AC wave spikes to make it to the next half wave of the AC input voltage. While the smoothing capacitor is large is smaller than the accumulation capacitor in a DC-to-DC converter which acts as an energy store for longer periods during step down operations. Additionally, discharge of the smoothing component is not as vital to safety as failure of a transistor will not result in an accidental laser discharge because the safety shutoffs and the transistor 321 in the current sources ensure that the laser generation component is isolated from the DC voltage in the smooth capacitor.

Components for generation of laser light are particularly susceptible to changes in current therefore current regulation is necessary. The AC-to-DC rectification component 301 and DC Filtering component 302 generate filtered DC voltage; the current source 303 creates a current regulated AC voltage through a transformer 321 to produce a current controlled voltage out of the transformer 321 regardless of the load. The current regulated AC voltage is further rectified by rectifier circuitry 322 (e.g., a diode bridge) before being passed to the laser generation component 304. In alternative implementations, the current source 303 may generate current pulses for operation of pulsed lasers. The constant current source 303 many include a plurality of high voltage switches 310, a transformer 321, rectifier circuitry 322, an inductor 323 and a filter capacitor 325. The high voltage switches 310 may be Gallium Nitride transistors, Silicon Carbide transistors or any other transistor or similar electrically operated switch with fast switching times and high voltage tolerances. A current source controller 307 is configured to orchestrate switching of the high voltage switches 310 to create an Alternating Current (AC) through the transformer and also maintain a constant DC current level after rectification 322. The filter capacitor 325 serves to filter out voltage ripple coming from the rectifier 322 through the inductor 323. The filter capacitor chosen for this purpose needs to have a small capacitance because its job is to reduce the amount of ripple in the system and storing a large amount of electricity is not necessary. By contrast, the accumulation capacitors in prior art laser power systems are large and have high capacitances because they act as charge stores during operation of the DC-to-DC converter circuits. In the circuit diagram shown in FIG. 3B only a single constant current source is shown for simplicity but it should be understood that, as with FIG. 2, aspects of the present disclosure include implementations in which multiple constant current sources are coupled to the AC-to-DC rectification component 301 shown in FIG. 3A connected at the arrows labeled "to current sources" and "return".

As shown in FIG. 3B, the current source 303 outputs current controlled voltage to the laser generation module 304. The laser generation module may comprise one or more laser diodes, flash bulbs, halogen lamps, electrical discharge in gas medium or other light generating component. The light generation module may also include other components that are not shown such as focusing lenses, mirrors and laser gain media. In some implementations, the laser may be a fiber laser that uses a fiber optic cable as the laser gain media. In other embodiments of the present disclosure, the laser may be crystal laser that uses a crystalline rod as a gain media. In yet other embodiments, the laser may be a gas or dye laser, which uses a gas or liquid dye as gain media respectively.

To ensure safe operation the independent safety shutoff systems have been moved to control the constant current source 303. Specifically, first and second safety shutoff systems exert control over the current source controller 307 and the plurality of high voltage switches 310 in the constant current source 303. A first safety shutoff 305 is integrated into the controller 307 for the constant current source. The controller 307 is configured to send a low or zero signal to the plurality of high voltage switches 310 when the safety shutoff 305 is triggered. The low or zero signal generated by the current source controller is provided to the high voltage switches in the constant current source 303, which requires power itself to cause the high voltage switch 310 to turn to the 'on' state. Independent of the first safety shutoff 305, a second safety shutoff 306 controls the power to the current source controller. Thus even if the current source controller signals an on state for the high voltage switches when the first safety switch is triggered the gates of the high voltage switches 310 will not be turned 'on' because no power is being provided to the current source controller to generate an 'on' signal. As shown, the second the second safety shutoff 306 may use a switch between the driver and the power supply for the driver to ensure that voltage does not driver when the safety shutoff is engaged. The second safety shutoff 306 may be controlled by an enable power signal from a safety-related sensor. As shown, the controller 307 may be coupled to the gate of the safety shutoff switch 311. If the safety shutoff is engaged, it may remove voltage from the gate causing the switch 311 to turn to the 'off' state. Thus, shutting off power to the current source controller 307 and eliminating the ability for the current source controller 307 to generate a signal for the high voltage switches 310. As an additional safety measure to generate an AC voltage through the transformer 321 coordinated switching of the high voltage switches 321 is required. If a malfunction occurs that causes a short circuit failure in the high voltage switches 310 or a switching signal fails leaving the switches in an 'on' state, direct current will flow through the transformer 321 and as such no voltage will be created out of transformer 321 effectively isolating the laser generation components 304 from the wall voltage. Thus, each safety shutoff works independently because a powered driver with a low or no PWM signal will not turn the high voltage switch on and without amplification; a high PWM signal is insufficient to turn on the high voltage switch.

Additionally, the safety system may utilize two separate safety triggers, which independently trigger the first or second safety shutoffs. For example, and without limitation, the safety system may be configured to shutoff the laser system discussed above whenever a door to the laser room is opened. The door may be arranged with safety-related sensors 324 such as sensors to determine whether the door is closed. Additionally, the laser system may include internal safety sensors such as sensors to detect whether a door or cover to the laser generation system enclosure is open. The external and internal safety sensors 324 may send external signals to the current source controller to notify the system that a safety shutoff should be engaged. The current source controller 307 may be configured to control the operation of the current source in response to an external signal from respective external or internal safety-related sensors. The current source controller 307 may be coupled to the safety shutoff mechanisms and may generate enabling signals that enable a normal operation of the current sources when all of the external and internal safety related sensors 324 do not output respective safety-related signals. The current source controller 307 may be configured to remove enabling signals in response to the safety-related signal of one of the internal or external sensors. Either of the one or more safety shutoffs being operative to switch 'off' and disable function of a high voltage switch 310 in the current source until an enabling signal resumes.

Additionally, the current controller 307 may include safety checks to ensure proper operation of the safety shutoff systems. The safety check of the first safety shutoff 305 may include a current measurement 312 after the transformer 321 when the first safety shutoff is engaged. This check ensures that the high voltage switch is turning off when the PWM is at low or off. If a current is measured across the transformer, either the switch has a closed circuit short or current source controller 307 is still generating signals for the high voltage switches 310. A safety check for the second safety shutoff 306 may include a voltage measurement 313 across the switch of the second safety shutoff when the second safety shutoff is engaged. If a voltage is detected then the switch has failed.

Figure 4:
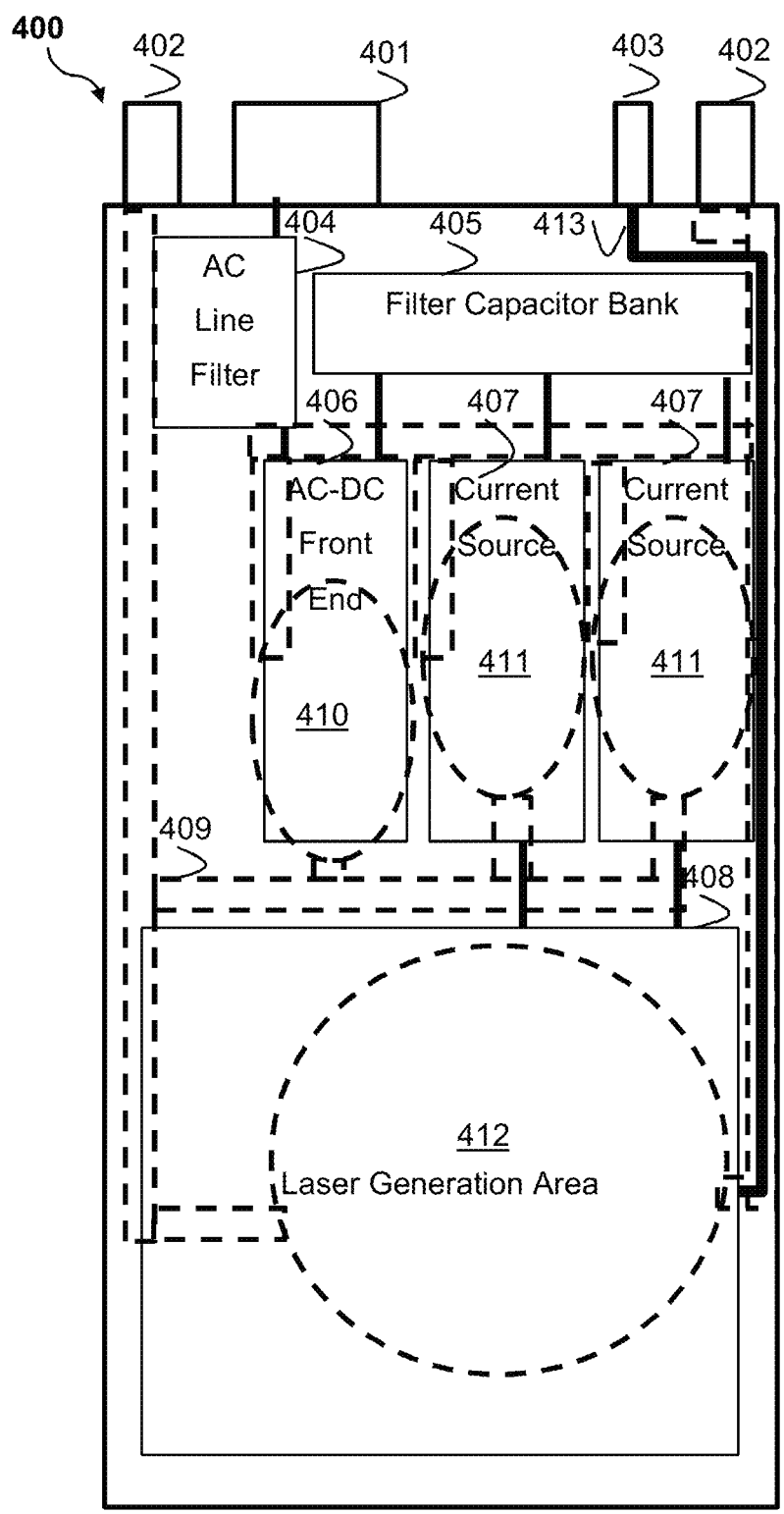
FIG. 4 is a top down view block diagram of the high voltage laser system according to aspects of the present disclosure.

FIG. 4 shows a block diagram of the layout of a laser system with cooling according to aspects of the present disclosure. The laser enclosure may include discrete modules for components of the laser system as well as multiple different ports for various inputs to the system. As shown the laser system includes cooling liquid input and output ports 401, AC outlet voltage input 402 and laser light output 403. Turning toward the internals of the laser system there may be an AC line-filtering module 404, DC Filter capacitor bank 405, Front-end AC-to-DC rectifier module 406, one or more constant current sources 407 and a laser generation area 408. Not depicted in the drawing are the current source controller and various other controllers for components in the system. The cooling system is indicated by dotted lines and runs underneath most active components and magnetics in the laser system. Cooling may be aided by the use of surface mount component including surface mount magnetics such as inductors and transformers. Cooling areas are located underneath each of the important laser system component and ceramic pads are integrated underneath the important components of front-end AC-to-DC rectifier module 410. Likewise, ceramic pads are located underneath the important components of the constant current sources 411. The cooling system also includes ceramic cooling pads for the laser generation components in the laser generation area. Additionally, metal heat exchangers are in contact with the circuit boards of the other modules of the laser system. During operation water or other coolants are circulated through the heat exchangers. This design allows the liquids to be kept out of the laser system itself.

Figure 5:
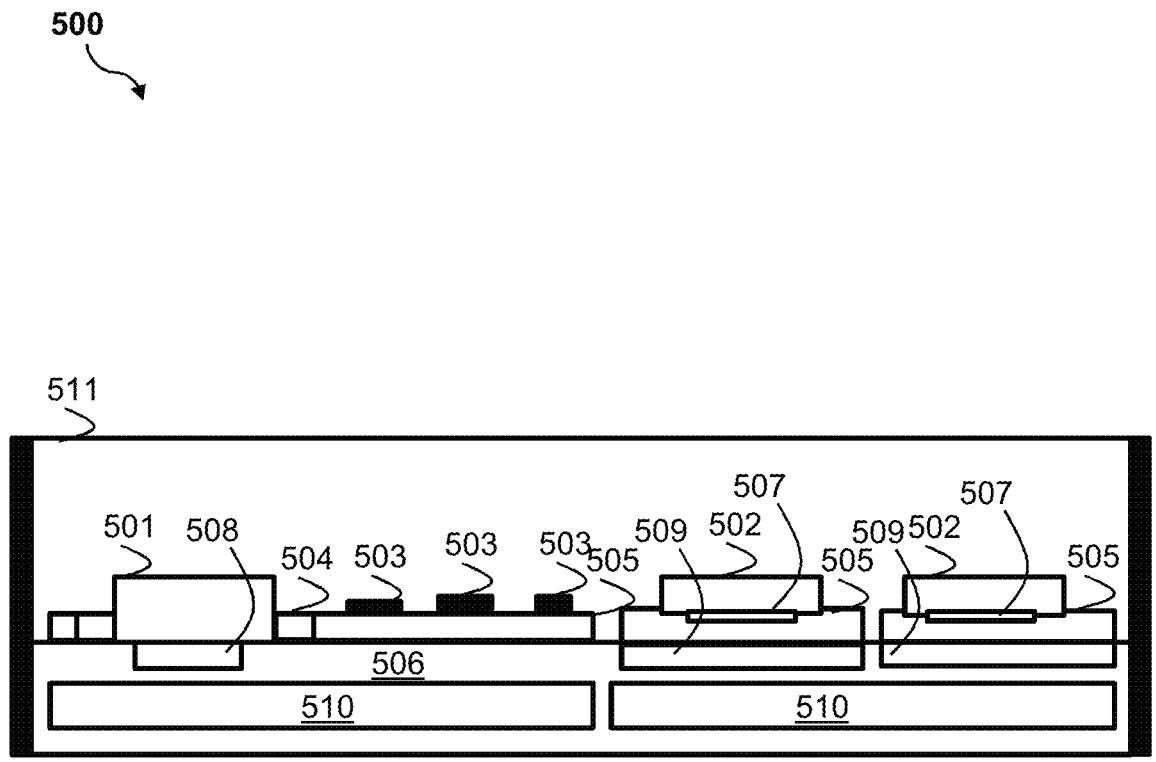
FIG. 5 is a simplified side view of the high voltage laser and cooling systems according to aspects of the present disclosure.

FIG. 5 is a simplified side view of the high voltage laser and cooling systems 500 according to aspects of the present disclosure. As shown in FIG. 5 conduits 510 for circulating cooling liquid to or from a heat exchanger 506 run underneath the laser enclosure 511. This allows the system to utilize liquid cooling without the danger of water egress inside the laser. The improved cooling system according to aspects of the present disclosure utilizes a metal heat exchanger 506. The metal heat exchanger 506 may include conduits 510, e.g., pipes or hollow cavities, for circulating coolant machined into the metal of the heat exchanger 506. The circuit boards for the different 505, components may be in contact with the heat exchanger 506. The heat from the surface mount passive components 503 may be dissipated by conductive cooling through the circuit boards 505. As shown some component boards such as the Front-end AC-to-DC rectifier board 505 may include various surface mount magnetics 501 such as transformers or inductors. The board 505 may include a cutout 504 for the surface mount magnetics 501. The surface mount magnetics 501 may be in contact with a ceramic cooling pad 508, which is embedded or otherwise affixed to the metal heat exchanger 506. In some embodiments, the surface mount magnetics 501 may be affixed to the ceramic cooling pad with thermally conductive glue or a thermally conductive paste. Some boards 505 may include surface mount active components 502 such as transistors. Active components 502 are particularly sensitive to cooling issues because they generate more heat during operation than passive components. A layer of thermally conductive metal 507 may be placed underneath the surface mount active component 502 and the surface mount active component 502 may be in contact with the thermally conductive metal 507. A thermally conductive glue or thermal paste may be place between the active component 502 and the thermally conductive metal 507 to aid in thermal conduction. The thermally conductive metal may be copper, nickel, tin, lead or a metal alloy. As shown, ceramic cooling pads 509 may be placed at least underneath the active components 502 of the circuit board 505. In alternative embodiments the ceramic cooling pads 509 may extend the entire length of the boards 505 or be placed selectively in areas of the board that are found to require additional thermal conduction cooling. Thermal conduction between the ceramic cooling pads 508, 509 and the circuit boards 505 may be aided through the use of thermal conductive glue or thermal paste. The use of liquid cooling with thermal conduction allows the system to run quieter as air-cooling fans integrated into the laser enclosure are not required.

Although liquid cooling of the electronic components is shown, the disclosure is not so limited. Liquid cooling may also be implemented with the laser light generation components. Diodes or other light producing components may be placed in contact with ceramic cooling pads and affixed using a thermally conductive glue or thermal paste. Additionally, other laser components such as laser gain media, mirrors and focusing lenses may be in contact with ceramic cooling pads. As with the above described circuit boards cavities for cooling liquid may run underneath the laser generation system through the metal heat exchangers and heat may be exchanged from the laser components through the ceramic pads to the metal heat exchanger and ultimately to the cooling liquid. The cooling liquid is circulated out of the heat exchanger and cooled through either a condenser or another heat exchanger.

The metal heat exchanger 506 may be any thermally conductive metal such as aluminum, copper, steel, magnesium etc. The ceramic cooling pads 508, 509 may be integrated into depressions machined into the metal heat exchanger and may be made of a thermally conductive ceramic such as aluminum nitride, silicon carbide, beryllium oxide, silicon nitride, polycrystalline diamond etc.

In some implementations, the high-voltage laser and cooling systems 500 may advantageously include any, some, or all of the following additional features:

The enclosure 511 may be sealed, e.g., with gaskets at all mechanical interfaces.

The conduits 510, e.g., pipes or cavities, for coolant may be hermetically sealed internal liquid cooling pipes (so there are no internal sources of moisture).

Figure 6:
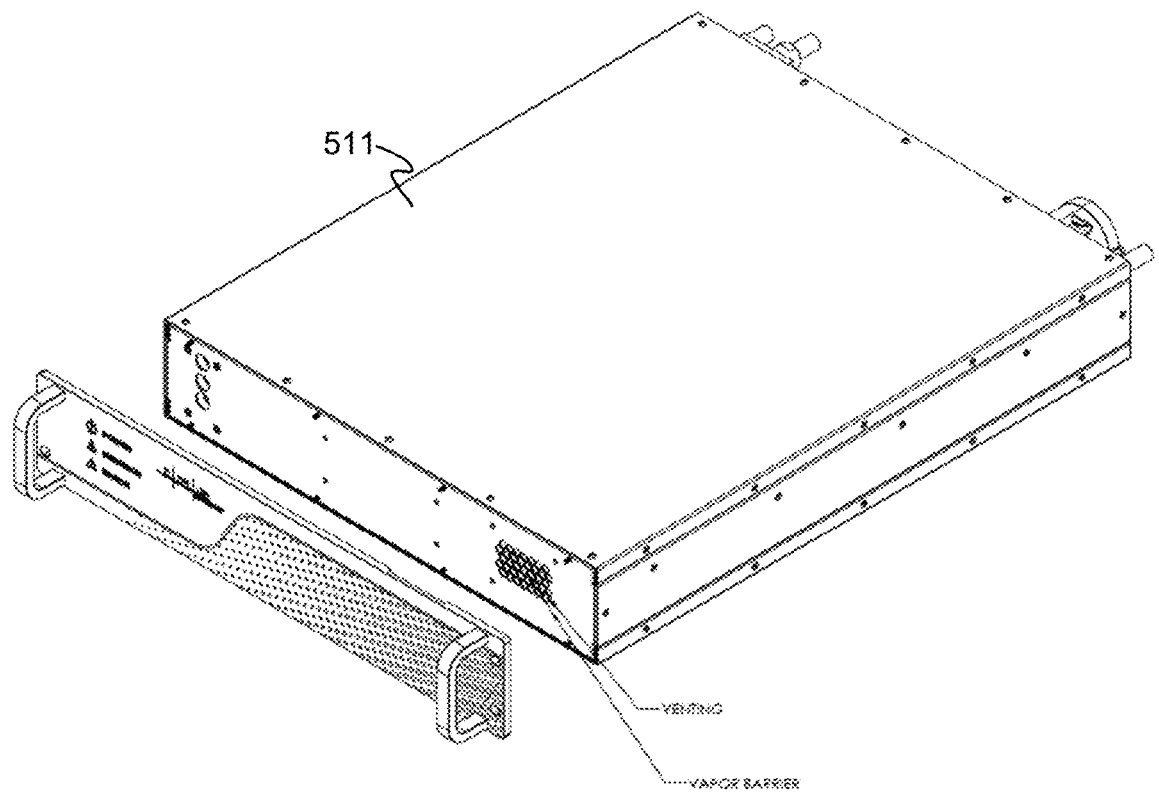
FIG. 6 is a three-dimensional diagram of a high voltage laser and cooling system with a dehumidifier according to aspects of the present disclosure.
Figure 7:
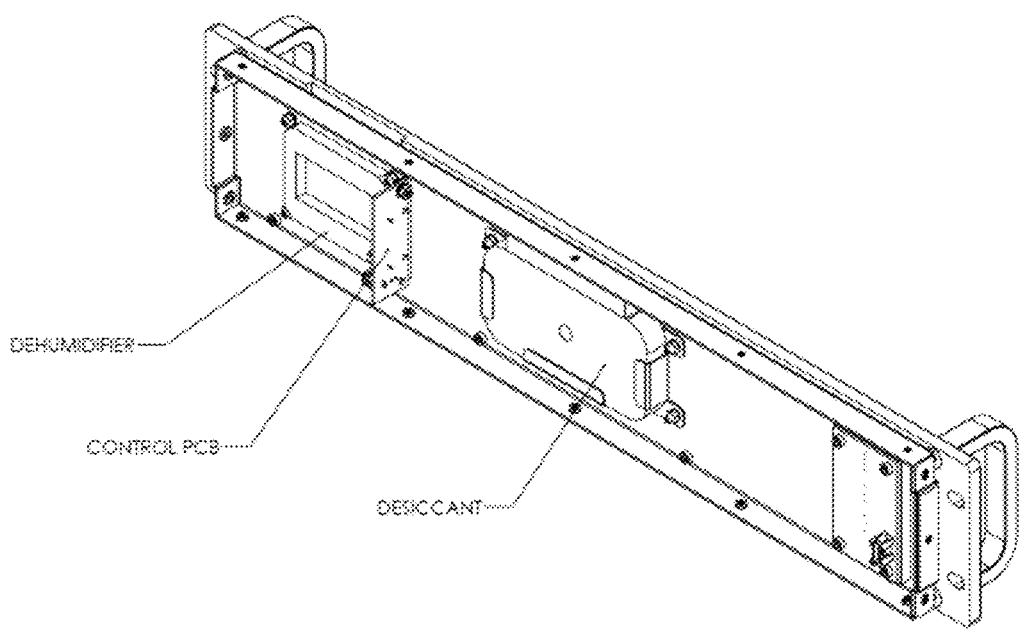
FIG. 7 is a three-dimensional diagram of a dehumidifier for a high voltage laser and cooling system according to aspects of the present disclosure.

The system 500 may include a dehumidifier, e.g., a membrane dehumidifier, configured to remove ambient moisture from within the enclosure 511, e.g., as depicted in FIG. 6 and FIG. 7. By way of example, the dehumidifier may be an electrolysis-type dehumidifier (e.g., a backwards fuel cell). An example of a commercially-available electrolysis-type dehumidifier is a ROSAHL Model M-3J1R General Dehumidifying Element from Ryosai Technica Co. Ltd. of Amagasaki, Japan.

The enclosure 511 may include an internal desiccant Pack for protection against moisture during power outages and shipping. By way of example, and not by way of limitation, such a desiccant pack may be a silica gel pack. An example of a commercially-available silica gel pack is a model SG-40 silica gel canister from Hydrosorbent of Ashley Falls, Mass.

According to certain aspects of the present disclosure, a laser system of the type described above may be implemented with a kilowatt class near-infrared 1 μm wavelength fiber laser as the laser generation module 304. Such a laser generation module may include a continuous wave (CW) ytterbium fiber laser in a rack mounting configuration. Such a configuration could deliver unmatched performance in an ultra-compact form factor with a high power to volume ratio. Such a fiber laser module may be configured to deliver CW power from up to 4 kilowatts to 8 kilowatts. Such laser systems have the potential to provide an advantageous combination of high CW power and an exclusive High Peak Power (HPP).

Laser systems according to aspects of the present disclosure may be implemented with significantly reduced in package volume per kilowatt. For example, one conventional fiber laser system with power ranging from about 1 kilowatt (KW) to about 1.5 KW had a package with dimensions of 48.8 centimeters (cm) by 58.0 cm by 13.3 cm for a volume of about 37,640 cm$^3$ or about 37.6 liters. This corresponds to a volume per kilowatt ranging from about 25 liters per kilowatt to about 37.6 liters per kilowatt. A 1 KW to 1.5 KW integrated laser system of the type described herein, e.g., with respect to FIG. 4, FIG. 5, and FIG. 6 may be implemented with an enclosure 511 having dimensions of 48.8 centimeters (cm) by 55.0 cm by 8.8 cm for a volume of about 22,670 cm$^3$ or about 22.7 liters. This corresponds to a volume per kilowatt ranging from about 15 liters per kilowatt to about 22 liters per kilowatt.

Even greater reductions in volume per kilowatt are possible for higher power laser systems. Specifically, a conventional system with power ranging from about 1 kilowatt (KW) to about 1.5 KW had a package with dimensions of 48.8 centimeters (cm) by 79.8 cm by 17.7 cm for a volume of about 68,930 cm$^3$ or about 68.9 liters. This corresponds to a volume per kilowatt ranging from about 17 liters per kilowatt to about 34.5 liters per kilowatt. A 1 KW to 1.5 KW integrated laser system of the type described herein, e.g., with respect to FIG. 4, FIG. 5, and FIG. 6 may be implemented with an enclosure 511 having dimensions of 48.8 centimeters (cm) by 76.0 cm by 8.8 cm for a volume of about 32,640 cm$^3$ or about 32.6 liters. This corresponds to a volume per kilowatt ranging from about 8.2 liters per kilowatt to about 16.3 liters per kilowatt.

In addition, the wall plug efficiencies for integrated laser systems in accordance with aspects of the present disclosure over the power ranges described above could all be approximately the same, e.g., around 38-40%

Laser system implementations in accordance with aspects of the present disclosure having a hermetically sealed rack design could conceivably operate in harsh of environments, including environments with over 90% relative humidity.

Laser systems in accordance with aspects of the present disclosure may incorporate a variety of remote control options including Analog, RS-232 or Ethernet, and built in self-diagnostics with Internet connectivity, the user friendly rack mount configuration is the most cost effective and adaptable solution for easy integration into production lines, enabling industry 4.0 Smart Manufacturing.

Laser systems in accordance with aspects of the present disclosure may be used in a variety of metal cutting, welding and drilling applications that benefit from fast and clean repeatable piercing and drilling in thicker materials, precision quality cutting, additional pulsed welding capabilities, and cutting and welding of highly reflective metals, all with increased process speed and quality. Laser systems in accordance with aspects of the present disclosure can deliver improved process quality and speed, and higher overall throughput, while saving material, time and operating costs.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A laser system comprising:
   a high voltage AC-to-DC power converter;
   one or more current sources coupled to the high voltage AC-to-DC power converter without a DC-to-DC converter between the one or more current sources and the AC-to-DC power Source wherein each of the one or more current sources include a high voltage switch and one or more independent safety shutoffs;
   a laser module operably coupled to the one or more current source and configured to emit electromagnetic radiation wherein the one or more safety shutoffs are configured to disable emission of electromagnetic radiation from the laser module when triggered
   a current source controller coupled to the one or more independent safety shutoffs configured to generate enabling signals that enable normal current source operation, wherein the current source controller includes a first safety shutoff safety check including circuitry configured to measure power to a driver for the high side voltage switch to determine proper operation of a first safety shutoff.

2. The laser system of claim 1 wherein the one or more safety shutoffs include the first safety shutoff having a circuit configured to interrupt power to a driver for the high voltage switch in the current source.

3. The laser system of claim 2 wherein the one or more safety shutoffs include a second safety shutoff having a circuit configured to instruct a controller to turn off the high voltage switch in the current source.

4. The laser system of claim 3 wherein the current source controller responds to a safety-related signal from a safety sensor by interrupting enabling signals that enable normal current source operation when the safety sensor does not output the safety related signal and, wherein the one or more independent safety shutoffs disable the high voltage switch in the current source in the absence of the enabling signal.

5. The laser system of claim 4 wherein the current source controller further comprises a second safety shutoff safety check including circuitry configured to measure power across the switch when the controller instructs the switch to turn off due to the second safety shutoff to determine proper operation of the second safety shutoff.

6. The laser system of claim 1 wherein the one or more safety shutoffs include a safety shutoff having a circuit configured to instruct a controller to turn off the high voltage switch in the current source.

7. The laser system of claim 1 wherein the high voltage AC-to-DC converter includes at least one transformer mounted in plane with a circuit board.

8. The laser system of claim 1 wherein the high voltage switch is a Gallium Nitride transistor.

9. The laser system of claim 1 wherein the high voltage switch is a surface mount switch and the AC-to-DC converter and the current source include thermally conductive metal underneath at least one surface mount components.

10. The leaser system of claim 1 further comprising a liquid cooling system including a metal heat exchanger coupled to at least one ceramic cooling pad and wherein at least one ceramic cooling pad is coupled to a side of at least one circuit board of the AC-to-DC power converter and a side of at least one circuit board of the current source.

11. The laser system of claim 10 wherein the laser module includes a laser diode coupled to at least one ceramic cooling pad.

12. The laser system of claim 1 wherein the one or more current sources further comprise a plurality of high voltage switches and a transformer.

13. The laser system of claim 12 wherein the plurality of high voltage switches are configured to receive a DC voltage from the AC-to-DC converter and generate an AC voltage through the transformer which is rectified to a DC voltage before being sent to the laser module.

14. The laser system of claim 13 wherein the one or more current sources further include a current source controller configured to control switching of the high voltage switches to generate an AC current through the transformer and maintain the rectified DC voltage at constant current level.

15. The laser system of claim 1 wherein a short circuit failure of the high voltage switch results in DC voltage at a transformer with no current flowing to the laser module.

16. The laser system of claim 1, further comprising an enclosure, wherein the high voltage AC-to-DC power converter, one or more current sources, and laser module are located in the enclosure.

17. The laser system of claim 16, wherein the enclosure is sealed.

18. The laser system of claim 17, wherein the enclosure is sealed with gaskets at one or more mechanical interfaces.

19. The laser system of claim 16, wherein the enclosure includes conduits for coolant coupled to a heat exchanger.

20. The laser system of claim 19, wherein the conduits include pipes or cavities that are hermetically sealed so there are no internal sources of moisture within the enclosure.

21. The system of claim 16, further comprising a dehumidifier configured to remove ambient moisture from within the enclosure.

22. The system of claim 21, wherein the dehumidifier is an electrolysis-type dehumidifier.

23. The system of claim 16, further comprising a desiccant element disposed within the enclosure.

24. The system of claim 16, wherein the desiccant element includes a silica gel desiccant pack.

25. The system of claim 16, wherein the dimensions of the enclosure and power of the laser system are such that the laser system has a volume per kilowatt ratio between about 8 liters per kilowatt and about 16 liters per kilowatt.

26. The system of claim 25, wherein the power of the laser system is between about 2 kilowatts and about 4 kilowatts.

27. The system of claim 16, wherein the dimensions of the enclosure and power of the laser system are such that the laser system has a volume per kilowatt ratio between about 15 liters per kilowatt and about 22 liters per kilowatt.

28. The system of claim 27, wherein the power of the laser system is between about 1 kilowatts and about 1.5 kilowatts.

29. The system of claim 1, wherein the laser module includes a fiber laser.

* * * * *